(12) United States Patent
Yamashita et al.

(10) Patent No.: US 10,720,397 B2
(45) Date of Patent: Jul. 21, 2020

(54) METHOD OF MANUFACTURING A SEMICONDUCTOR DEVICE

(71) Applicant: Mitsubishi Electric Corporation, Tokyo (JP)

(72) Inventors: Tetsuo Yamashita, Tokyo (JP); Tomohiro Hieda, Tokyo (JP); Masaomi Miyazawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/385,683

(22) Filed: Apr. 16, 2019

(65) Prior Publication Data

US 2019/0244913 A1 Aug. 8, 2019

Related U.S. Application Data

(62) Division of application No. 15/841,355, filed on Dec. 14, 2017, now Pat. No. 10,347,593.

(30) Foreign Application Priority Data

Apr. 17, 2017 (JP) .................. 2017-081446

(51) Int. Cl.
*H01L 23/00* (2006.01)
*H01L 23/053* (2006.01)
(Continued)

(52) U.S. Cl.
CPC ........ *H01L 23/562* (2013.01); *H01L 21/4817* (2013.01); *H01L 21/4875* (2013.01);
(Continued)

(58) Field of Classification Search
CPC .................. H01L 21/52; H01L 23/045; H01L 2224/48175; H01L 2224/40245; H01L 24/48
See application file for complete search history.

(56) References Cited

U.S. PATENT DOCUMENTS

2005/0224945 A1* 10/2005 Saito ................. H01L 23/49575
257/686
2013/0009300 A1* 1/2013 Yato .................. H01L 23/49524
257/676

(Continued)

FOREIGN PATENT DOCUMENTS

| JP | 2003-224243 A | 8/2003 |
|---|---|---|
| JP | 2013-219267 A | 10/2013 |
| WO | 2015/079600 A1 | 6/2015 |

*Primary Examiner* — Jay C Chang
*Assistant Examiner* — Mikka Liu
(74) *Attorney, Agent, or Firm* — Studebaker & Brackett PC

(57) ABSTRACT

According to the present invention, a semiconductor device includes a substrate having a metallic pattern formed on a top surface of the substrate, a semiconductor chip provided on the metallic pattern, a back surface electrode terminal in flat plate form connected to the metallic pattern with a wire, a front surface electrode terminal in flat plate form, the front surface electrode terminal being in parallel to the back surface electrode terminal above the back surface electrode terminal, extending immediately above the semiconductor chip, and being directly joined to a top surface of the semiconductor chip, a case surrounding the substrate and a seal material for sealing an inside of the case.

3 Claims, 7 Drawing Sheets

(51) Int. Cl.
*H01L 23/24* (2006.01)
*H01L 21/48* (2006.01)
*H01L 21/52* (2006.01)
*H01L 23/045* (2006.01)
*H01L 23/10* (2006.01)

(52) U.S. Cl.
CPC ............ *H01L 21/52* (2013.01); *H01L 23/045* (2013.01); *H01L 23/053* (2013.01); *H01L 23/10* (2013.01); *H01L 23/24* (2013.01); *H01L 24/40* (2013.01); *H01L 24/32* (2013.01); *H01L 24/45* (2013.01); *H01L 24/48* (2013.01); *H01L 2224/32225* (2013.01); *H01L 2224/32245* (2013.01); *H01L 2224/33181* (2013.01); *H01L 2224/40245* (2013.01); *H01L 2224/45124* (2013.01); *H01L 2224/45147* (2013.01); *H01L 2224/48175* (2013.01); *H01L 2224/73265* (2013.01); *H01L 2924/1033* (2013.01); *H01L 2924/10253* (2013.01); *H01L 2924/10254* (2013.01); *H01L 2924/10272* (2013.01); *H01L 2924/1203* (2013.01); *H01L 2924/13055* (2013.01); *H01L 2924/19107* (2013.01); *H01L 2924/351* (2013.01)

(56) References Cited

U.S. PATENT DOCUMENTS

2013/0270688 A1 10/2013 Ota et al.
2015/0035138 A1 2/2015 Miyamoto et al.
2016/0300770 A1 10/2016 Taya

* cited by examiner

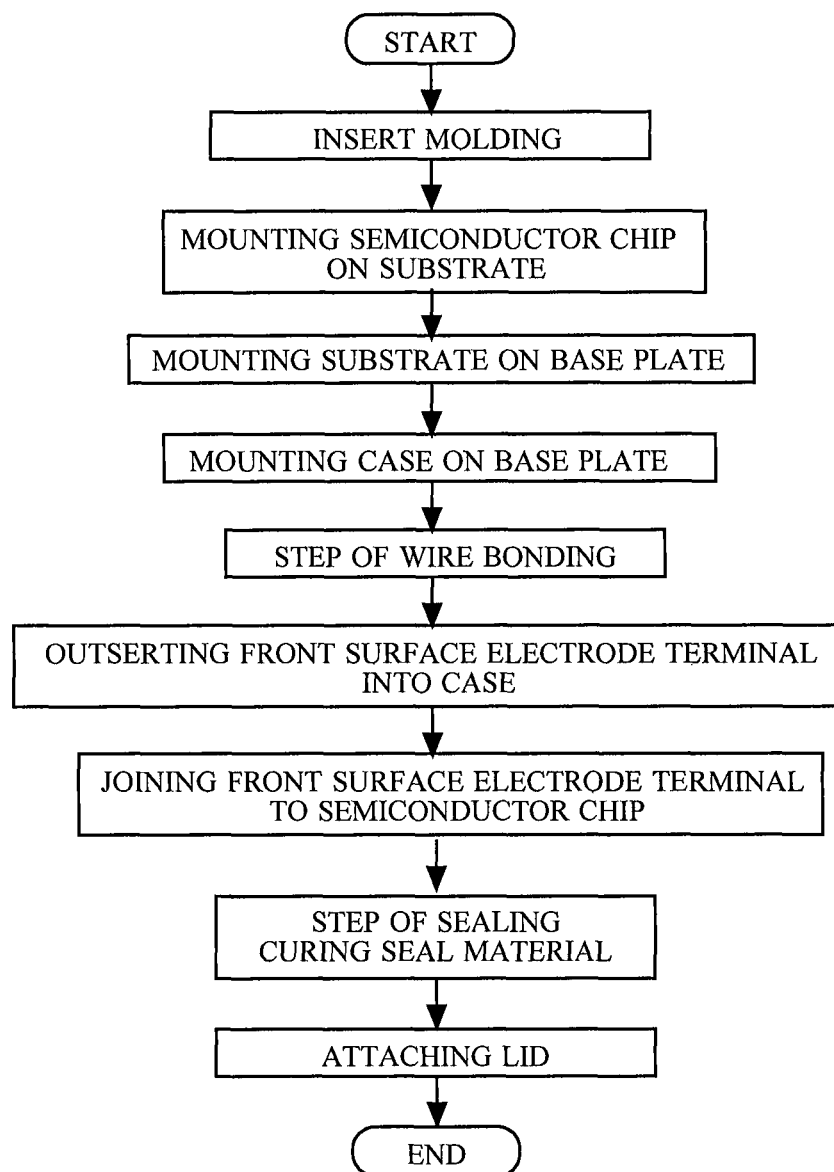

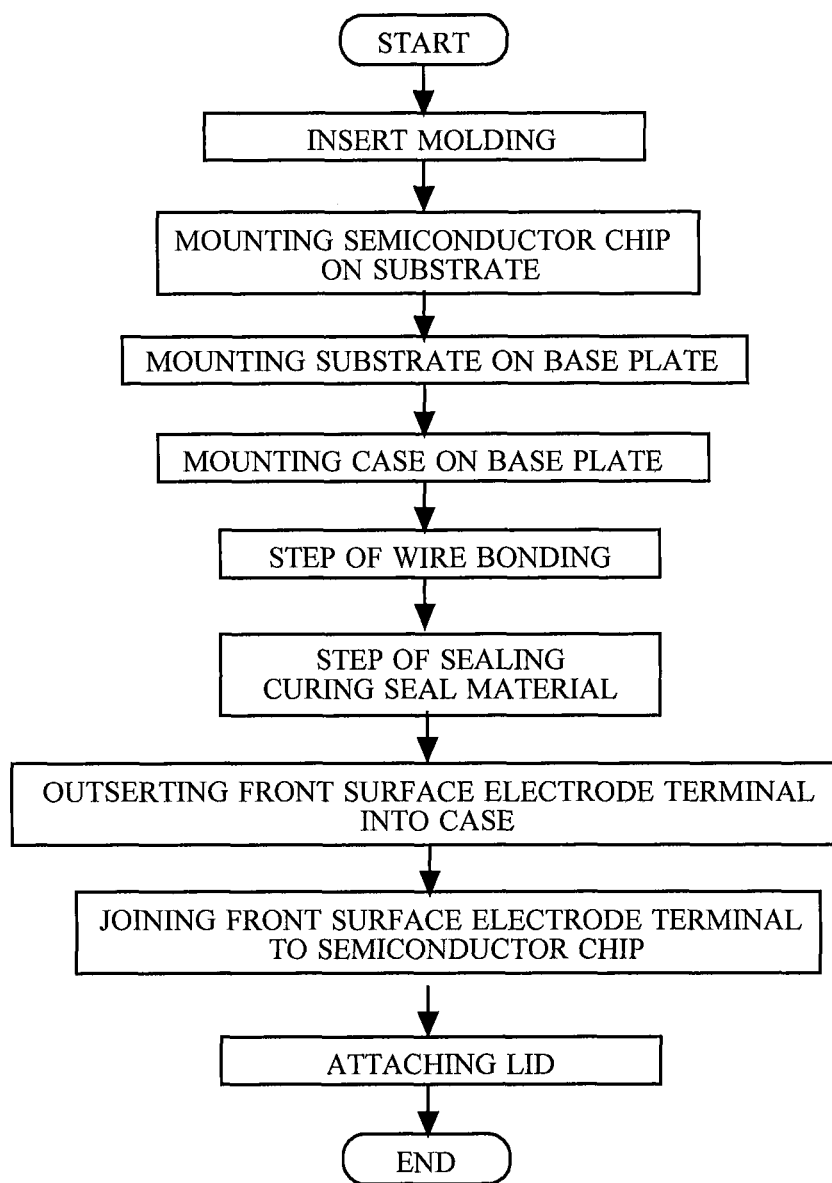

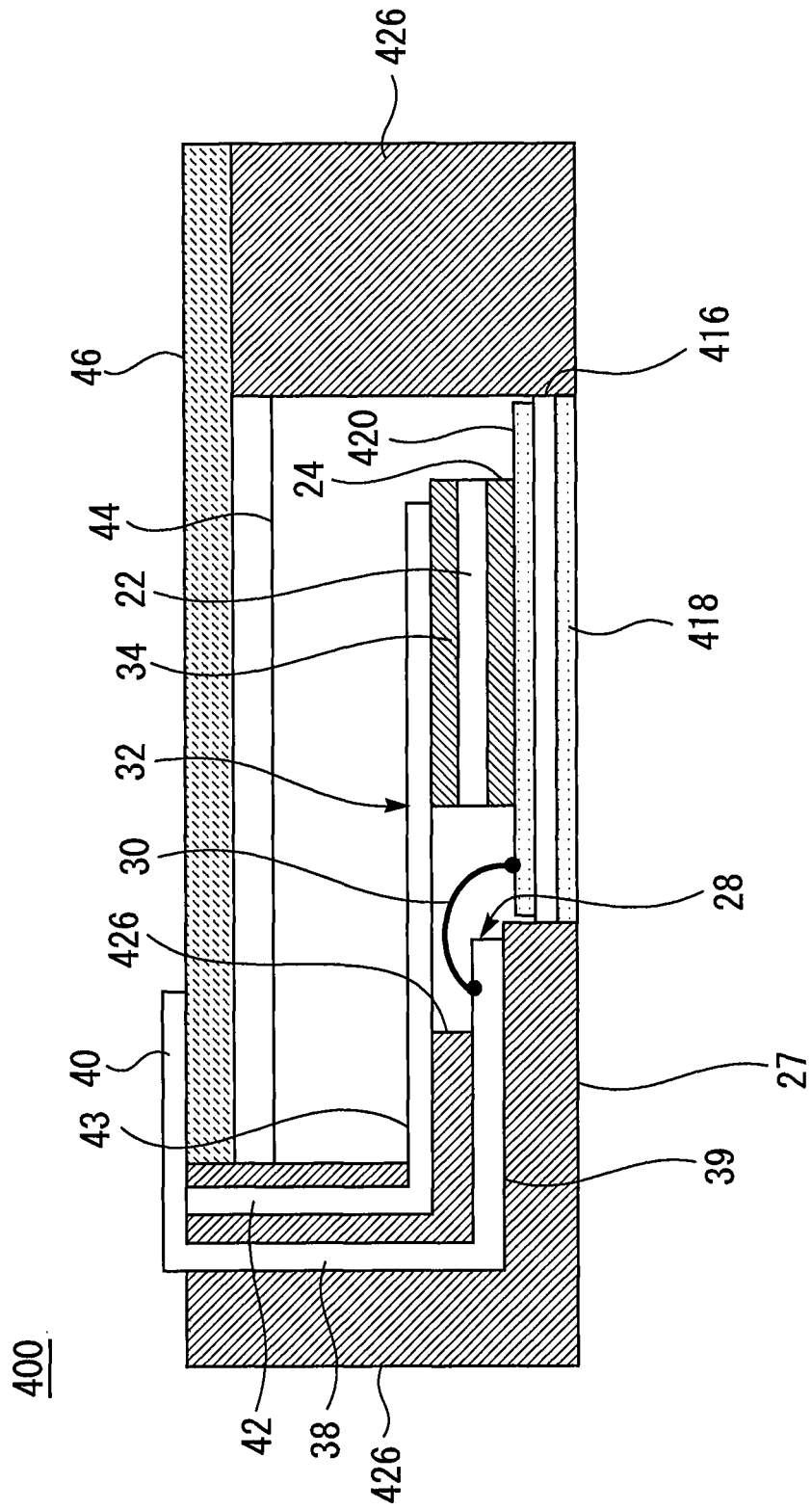

METHOD OF MANUFACTURING A SEMICONDUCTOR DEVICE

CROSS-REFERENCE TO RELATED APPLICATIONS

This application is a Divisional of U.S. patent application Ser. No. 15/841,355 filed on Dec. 14, 2017, which claims priority to Japanese Patent Application No. 2017-081446 filed on Apr. 17, 2017 the entire contents of which are incorporated herein by reference.

BACKGROUND OF THE INVENTION

Field

The present invention relates to a semiconductor device and a method of manufacturing the semiconductor device.

Background

In JP 2003-224243 A, wire bonding is employed as a method for energizing a power device chip from an external electrode. In wire bonding, an electrode part of the power device and an external electrode are connected with a wire.

In general, a wire junction receives a stress depending on a cold heat cycle due to a current balance in a power device chip. Further, in order to achieve an increase in the life of the junction, an increase in the size or cost of a package may be caused. Accordingly, a problem to be solved, in particular, in a large-capacity module including a plurality of power device chips, is to obtain a low-cost, downsized package which can obtain a longer life.

SUMMARY

The present invention has been made in view of the above-mentioned problem, and an object of the present invention is to obtain a semiconductor device capable of achieving an increase in life and downsizing, and a method of manufacturing the semiconductor device.

The features and advantages of the present invention may be summarized as follows.

According to the first invention, a semiconductor device includes a substrate having a metallic pattern formed on a top surface of the substrate, a semiconductor chip provided on the metallic pattern, a back surface electrode terminal in flat plate form connected to the metallic pattern with a wire, a front surface electrode terminal in flat plate form, the front surface electrode terminal being in parallel to the back surface electrode terminal above the back surface electrode terminal, extending immediately above the semiconductor chip, and being directly joined to a top surface of the semiconductor chip, a case surrounding the substrate and a seal material for sealing an inside of the case.

According to the second invention, a method of manufacturing a semiconductor device includes a step of mounting a semiconductor chip on a metallic pattern provided on a top surface of a substrate, a step of providing a case surrounding the substrate, and a back surface electrode terminal in flat plate form, a step of wire bonding connecting the back surface electrode terminal and the metallic pattern with a wire, a step of providing, above the back surface electrode terminal, a front surface electrode terminal in flat plate form, the front surface electrode terminal extending immediately above the semiconductor chip in parallel to the back surface electrode terminal, and directly joining the front surface electrode terminal to a top surface of the semiconductor chip and a step of sealing an inside of the case with a seal material after the step of wire bonding.

Other and further objects, features and advantages of the invention will appear more fully from the following description.

BRIEF DESCRIPTION OF DRAWINGS

FIG. 5 is a flowchart illustrating the method of manufacturing the semiconductor device according to the second embodiment.

FIG. 6 is a flowchart illustrating a method of manufacturing the semiconductor device according to a modified example of the second embodiment.

FIG. 7 is a sectional view illustrating a semiconductor device according to a third embodiment.

DESCRIPTION OF EMBODIMENTS

Figure 1:
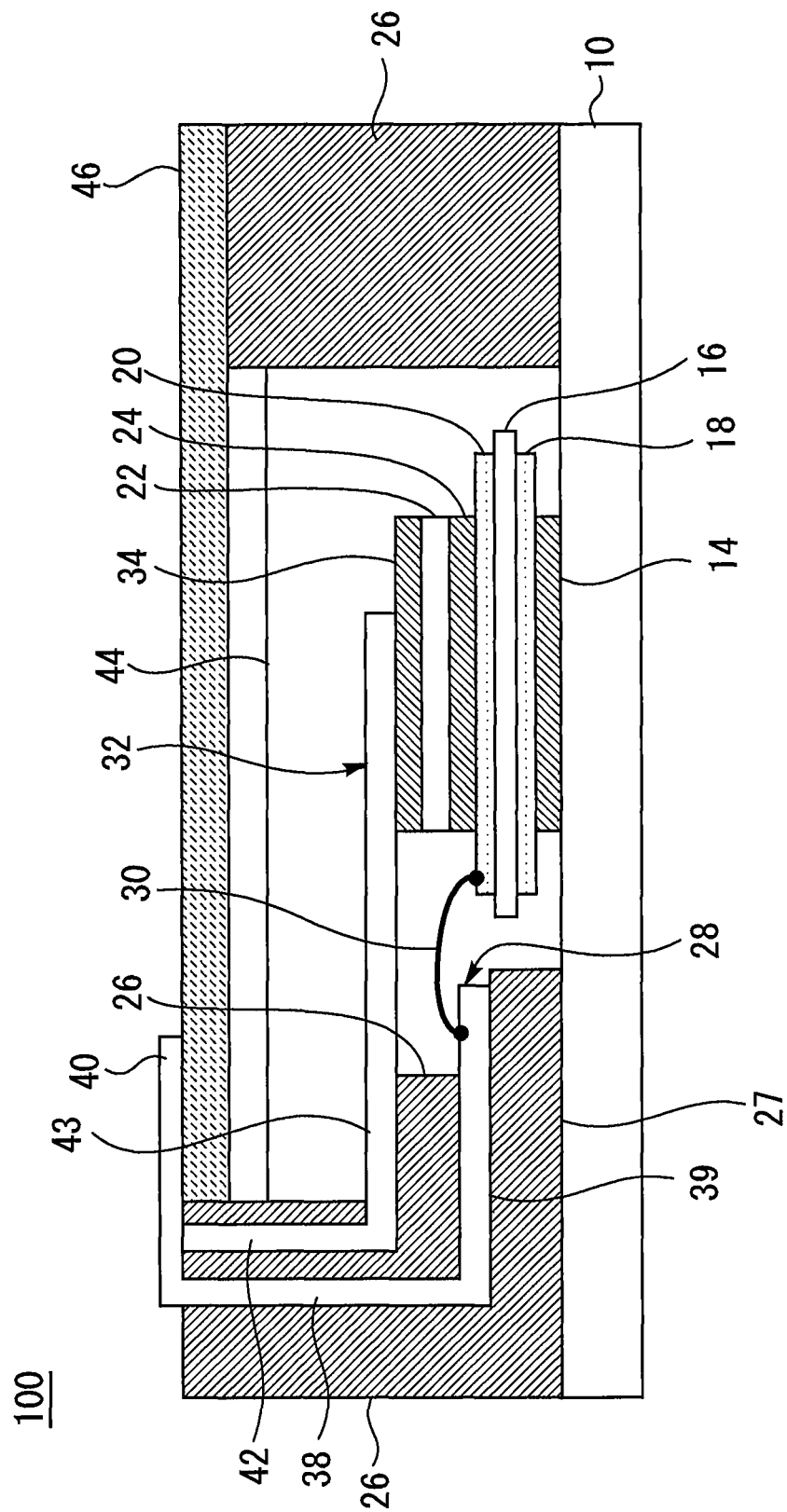
FIG. 1 is a sectional view illustrating a semiconductor device according to a first embodiment.

A semiconductor device and a method of manufacturing the semiconductor device according to an embodiment of the present invention will be described with reference to the accompanying drawings. Components identical or corresponding to each other are indicated by the same reference characters, and repeated description of them is avoided in some cases.

First Embodiment

FIG. 1 is a sectional view illustrating a semiconductor device 100 according to a first embodiment. The semiconductor device 100 includes a base plate 10. The base plate 10 is formed of copper, aluminum, or the like. A substrate 16 is provided on the base plate 10. A metallic pattern 18 is provided on the back surface of the substrate 16. The substrate 16 is joined to the base plate 10 with a solder 14 through the metallic pattern 18. The substrate 16 has a metallic pattern 20 on the top surface of the substrate 16. The substrate 16 and the metallic patterns 18 and 20 constitute an insulating substrate.

The semiconductor device 100 includes a plurality of semiconductor chips 22. The plurality of semiconductor chips 22 include a switching device and a diode. In this embodiment, the switching device is an IGBT (Insulated Gate Bipolar Transistor). The plurality of semiconductor chips 22 are provided on the metallic pattern 20. The number of the semiconductor chips 22 included in the semiconductor device 100 may be one or more. Further, a switching device and a diode may be provided on a single semiconductor chip 22. Each semiconductor chip 22 is joined to the metallic pattern 20 with a solder 24.

A case 26 is provided on the base plate 10. The case 26 is provided on a peripheral portion of the base plate 10. The substrate 16 is surrounded by the case 26. The case 26 is formed of resin.

The semiconductor device 100 includes a back surface electrode terminal 28. The back surface electrode terminal 28 is buried in the case 26. The back surface electrode terminal 28 has a flat plate form. The back surface electrode terminal 28 includes a horizontal part 39 which extends in parallel to the top surface of the substrate 16. The one end of the horizontal part 39 is exposed from the case 26. The one end of the horizontal part 39 is provided adjacent to an end of the substrate 16. The back surface electrode terminal 28 is connected to the metallic pattern 20 with a wire 30 at the one end of the horizontal part 39. The wire 30 is formed of copper, aluminum, or the like.

A vertical part 38 which is vertical to the top surface of the substrate 16 extends from the other end of the horizontal part 39. An upper end of the vertical part 38 is exposed from the case 26. An external connection part 40 is provided at the upper end of the vertical part 38. The external connection part 40 is a part for connecting an external device to the back surface electrode terminal 28.

A pedestal part 27 which extends in parallel to the top surface of the substrate 16 is provided at a side of the case 26 where the back surface electrode terminal 28 is provided. The pedestal part 27 covers a part of the horizontal part 39 of the back surface electrode terminal 28. A front surface electrode terminal 32 is provided on the pedestal part 27. The front surface electrode terminal 32 has a flat plate form. The front surface electrode terminal 32 is parallel to the back surface electrode terminal 28 above the back surface electrode terminal 28.

The front surface electrode terminal 32 includes a horizontal part 43 which extends in parallel to the top surface of the substrate 16. The horizontal part 43 of the front surface electrode terminal 32 extends immediately above each semiconductor chip 22. The front surface electrode terminal 32 is directly joined to the top surface of the semiconductor chip 22 with a solder 34. A vertical part 42 which is vertical to the top surface of the substrate 16 extends from an end of the horizontal part 43 that is opposite to the semiconductor chip 22. The vertical part 42 is buried in the case 26. An upper end of the vertical part 42 is exposed from the case 26. The upper end of the vertical part 42 is connected to the external device. The horizontal part 43 is exposed from the case 26.

The front surface electrode terminal 32 includes a lead frame. The lead frame is joined to the top surface of each of the plurality of semiconductor chips 22. In other words, the top surface of each of the plurality of semiconductor chips 22 is energized by a single front surface electrode terminal 32.

The front surface electrode terminal 32 and the back surface electrode terminal 28 constitute a main terminal electrode of the semiconductor device 100. The main terminal electrode has a parallel plate structure. The back surface electrode terminal 28 and the wire 30 are covered with the front surface electrode terminal 32.

The inside of the case 26 is sealed with a seal material 44. The seal material 44 is also called an insulating material. The substrate 16, the metallic pattern 20, the semiconductor chips 22, the back surface electrode terminal 28, and the front surface electrode terminal 32 are sealed with the seal material 44. The seal material 44 is, for example, gel or resin. When each semiconductor chip 22 is a power device chip formed of silicon or silicon carbide, a linear expansion difference between the semiconductor chip and the lead frame may become large. In order to disperse a thermal stress generated due to the linear expansion difference, it is desirable to adopt resin, which is harder than gel, as the seal material 44. This leads to an improvement in reliability.

A lid 46 is provided on the case 26. An area surrounded by the case 26 is covered with the lid 46. A part of the case 26 where the lid 46 is provided is formed with a height lower by an amount equal to the thickness of the lid 46. Thus, the height of the top surface of the lid 46 can be set to be equal to the height of a part of the case 26 where the lid 46 is not provided. Note that the external connection part 40 extends above the lid 46.

Figure 2:
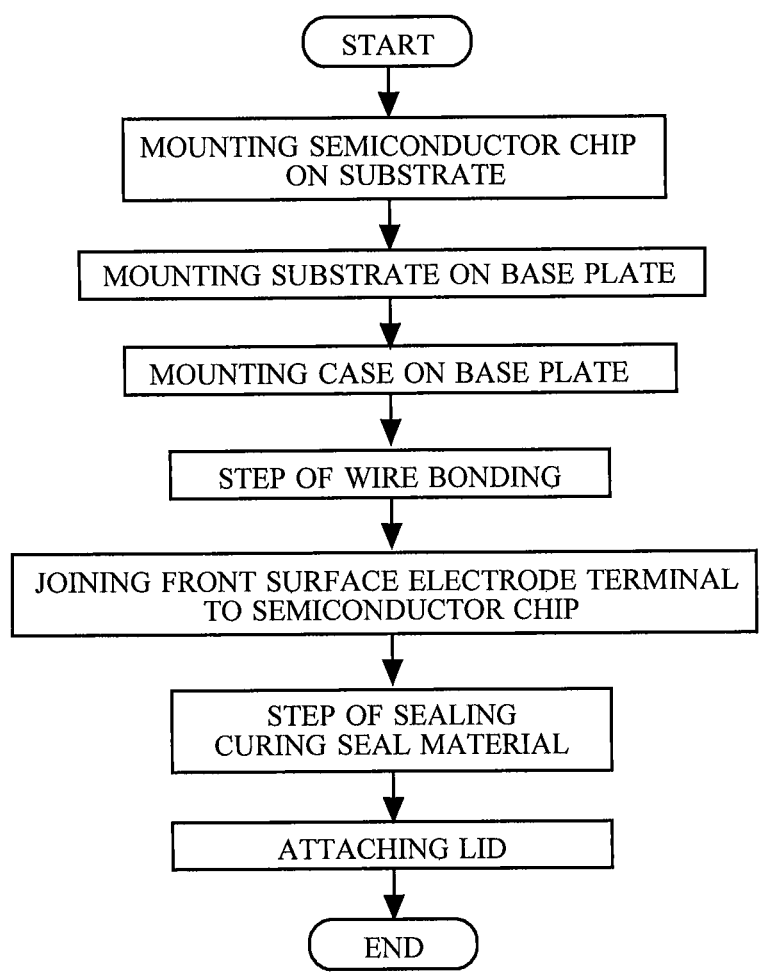
FIG. 2 is a flowchart illustrating the method of manufacturing the semiconductor device according to the first embodiment.

Next, a method of manufacturing the semiconductor device 100 according to this embodiment will be described. FIG. 2 is a flowchart illustrating the method of manufacturing the semiconductor device 100 according to the first embodiment. First, the semiconductor chips 22 are mounted on the metallic pattern 20 which is provided on the top surface of the substrate 16. In this case, the solder 24 is provided on the metallic pattern 20 in advance. Thus, the metallic pattern 20 and the semiconductor chips 22 are joined together with the solder 24. Accordingly, the plurality of semiconductor chips 22 including the IGBT and the diode are mounted on the substrate 16. Next, the solder 34 is provided on each semiconductor chip 22. The solder 34 may be mounted on each semiconductor chip 22 in advance.

Next, the substrate 16 is mounted on the base plate 10. In this case, the solder 14 is mounted on the base plate 10 in advance. Thus, the base plate 10 and the substrate 16 are joined together with the solder 14. After the substrate 16 is mounted on the base plate 10, the semiconductor chips 22 may be mounted on the substrate 16.

Next, the base plate 10 is mounted on the case 26. In this case, the back surface electrode terminal 28, the front surface electrode terminal 32, and the case 26 are integrated in advance. At this time, the back surface electrode terminal 28, the front surface electrode terminal 32, and the case 26 are formed in such a manner that the front surface electrode terminal 32 is provided above the back surface electrode terminal 28. Accordingly, by the step of mounting the case 26 on the base plate 10, the case 26, the front surface electrode terminal 32, and the back surface electrode terminal 28 are provided on the semiconductor device 100.

The front surface electrode terminal 32 need not necessarily be integrated with the case 26. In this case, the front surface electrode terminal 32 may be provided on the case 26 after a step of wire bonding which is described below. Further, in this embodiment, the back surface electrode terminal 28 is buried in the case 26, but the location of the back surface electrode terminal 28 is not limited to this. The back surface electrode terminal 28 may be provided on, for example, the pedestal part 27.

Next, the step of wire bonding is carried out. In the step of wire bonding, the back surface electrode terminal 28 and the metallic pattern 20 are connected with the wire 30. In the step of wire bonding, wires or lead frames may be used to connect the semiconductor chips 22 with terminals of the semiconductor device 100, the semiconductor chips 22 with each other, and the semiconductor chips 22 with the metallic pattern 20. Next, the front surface electrode terminal 32 and the top surface of each semiconductor chip 22 are directly joined together with the solder 34.

Next, a step of sealing is carried out. In the step of sealing, the seal material 44 is injected into the case 26 to be sealed. Next, the seal material 44 is hardened. This step is also called curing. Next, the lid 46 is attached. Thus, the manufacturing process of the semiconductor device 100 according to this embodiment is terminated.

Figure 3:
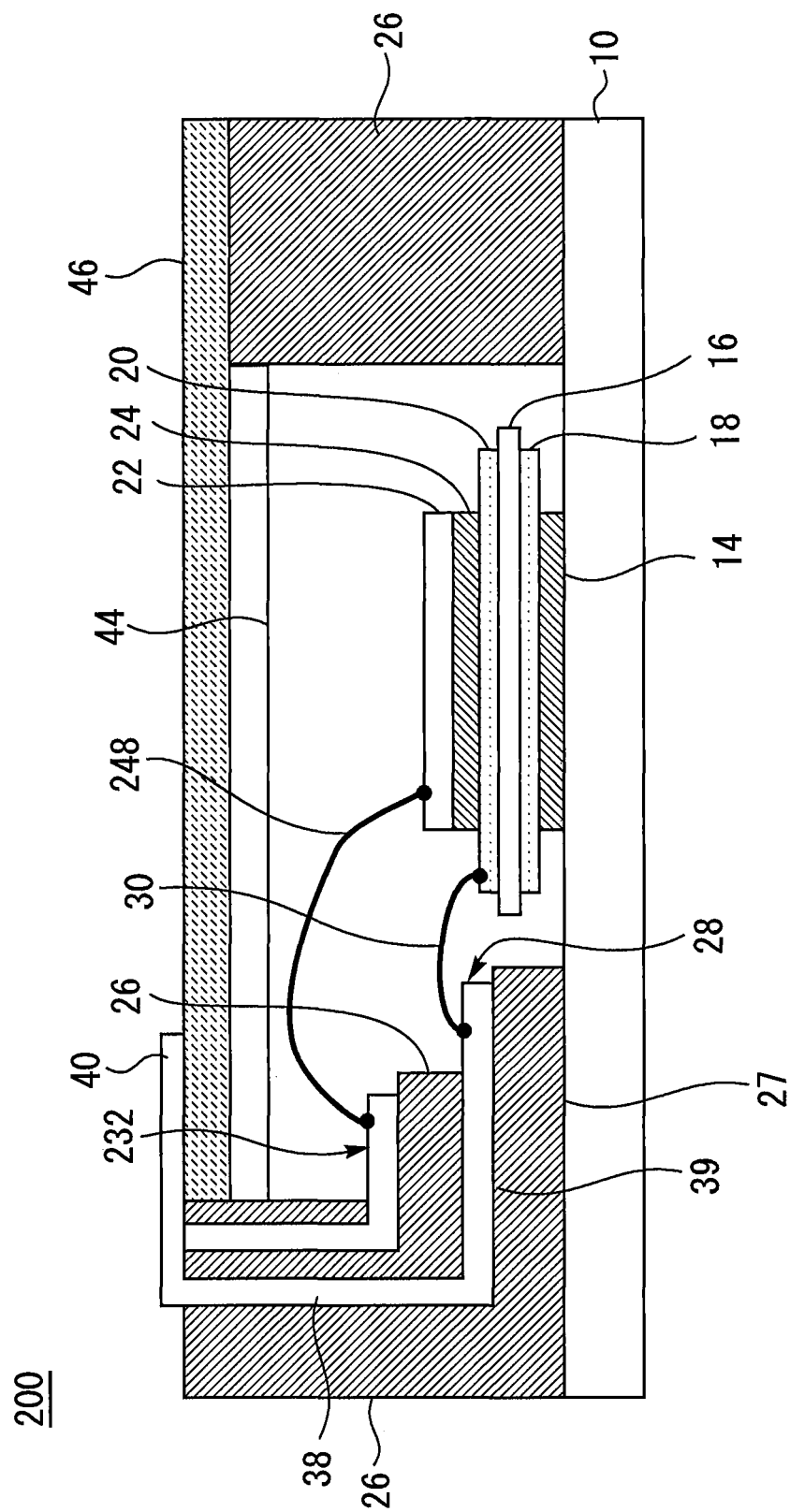
FIG. 3 is a sectional view illustrating a semiconductor device according to a comparative example.

FIG. 3 is a sectional view illustrating a semiconductor device 200 according to a comparative example. The semiconductor device 200 differs from the semiconductor device 100 in regard to the structure of a front surface electrode terminal 232. The front surface electrode terminal 232 is connected to the top surface of the semiconductor chip 22 with a wire 248. In the semiconductor device 200, the two wires 30 and 248, which vertically overlap each other, are formed. According to this structure, the length of the wire 248, which is located above the wire 30, is longer than the length of the wire 30. Accordingly, the resistance and inductance components of the wire 248 increase. Therefore, the junction of the wire 248 may be greatly affected by a thermal stress due to a repetition of ON/OFF of each semiconductor chip 22. As a result, the life of the junction of the wire 248 may be shortened and the function of the semiconductor device 200 may be stopped.

On the other hand, in this embodiment, the front surface electrode terminal 32 is joined onto each semiconductor chip 22 with a solder. Accordingly, the resistance to the thermal stress on the junction can be improved as compared with the case where the front surface electrode terminal is connected to each semiconductor chip with the wire 248. In addition, wire bonding is employed for connection between the back surface electrode terminal 28 and the metallic pattern 20, which leads to downsizing of a package as compared with the case where the back surface electrode terminal 28 and the metallic pattern 20 are connected with a lead frame.

In this case, the temperature at the junction of the wire connecting the back surface electrode terminal 28 and the metallic pattern 20 is generally lower than that at the front surface electrode terminal 32. Accordingly, the back surface electrode terminal 28 is connected with the wire 30 and the front surface electrode terminal 32, which is easily heated to a high temperature, is directly joined to the semiconductor chip 22, thereby downsizing the package while ensuring the reliability. Accordingly, in this embodiment, an increase in life and downsizing of the semiconductor device 100 can be achieved.

Further, by connecting the back surface electrode terminal 28 and the metallic pattern 20 with the wire 30, the manufacturing cost of the semiconductor device 100 can be reduced as compared with the case where the back surface electrode terminal 28 and the metallic pattern 20 are connected with a lead frame. Accordingly, the semiconductor device 100 can be manufactured at a low cost while ensuring the reliability of the junction in this embodiment.

Further, by connecting the back surface electrode terminal 28 and the metallic pattern 20 with the wire 30, a large gap can be ensured below the front surface electrode terminal 32 as compared with the case where the back surface electrode terminal 28 and the metallic pattern 20 are connected with a lead frame. Accordingly, it is easy for the seal material 44 to flow into the case, and thus the inside of the case 26 can be reliably sealed.

The front surface electrode terminal 32 and the back surface electrode terminal 28 are flat plate form and are parallel to each other. In this structure, magnetic fluxes generated in the front surface electrode terminal 32 and the back surface electrode terminal 28 due to variations in current cancel each other out. Accordingly, the magnetic flux generated in the semiconductor device 100 can be suppressed, so that the inductance of the semiconductor device 100 can be reduced. Therefore, the thermal stress generated in the semiconductor device 100 can be suppressed. Further, high-speed switching can be achieved in the semiconductor device 100.

In the semiconductor device 200 according to the comparative example, a plurality of semiconductor chips 22 and a plurality of front surface electrode terminals 232 are connected with a plurality of wires, respectively. On the other hand, in this embodiment, a single lead frame is directly connected to the plurality of semiconductor chips 22. In other words, the plurality of wires and the plurality of front surface electrode terminals 232 can be replaced by a single lead frame. Accordingly, the semiconductor device 100 can be easily manufactured.

As a modified example of this embodiment, each semiconductor chip 22 may be formed of a wide band gap semiconductor. The wide band gap semiconductor is, for example, silicon carbide, a gallium nitride-based material, or diamond. When each semiconductor chip 22 is formed of the wide band gap semiconductor, the withstand voltage and allowable current density of each semiconductor chip 22 can be improved. Therefore, the semiconductor chip 22 can be downsized, which leads to further downsizing of the semiconductor device 100.

When each semiconductor chip 22 is formed of a wide band gap semiconductor, a power loss in each semiconductor chip 22 can be reduced. Accordingly, the efficiency of each semiconductor chip 22 can be enhanced, and thus the efficiency of the semiconductor device 100 can be enhanced. As this modified example, in the plurality of semiconductor chips 22, one of the switching device and the diode may be formed of the wide band gap semiconductor. Also in this case, advantageous effects of downsizing and an increase in efficiency of the semiconductor device 100 can be obtained.

These modifications can be applied, as appropriate, to a semiconductor device and a method of manufacturing the semiconductor device according to the following embodiments. Note that the semiconductor device and the method of manufacturing the semiconductor device according to the following embodiments are similar to those of the first embodiment in many respects, and thus differences between the semiconductor device and the method of manufacturing the semiconductor device according to the following embodiments and those of the first embodiment will be mainly described below.

Second Embodiment

Figure 4:
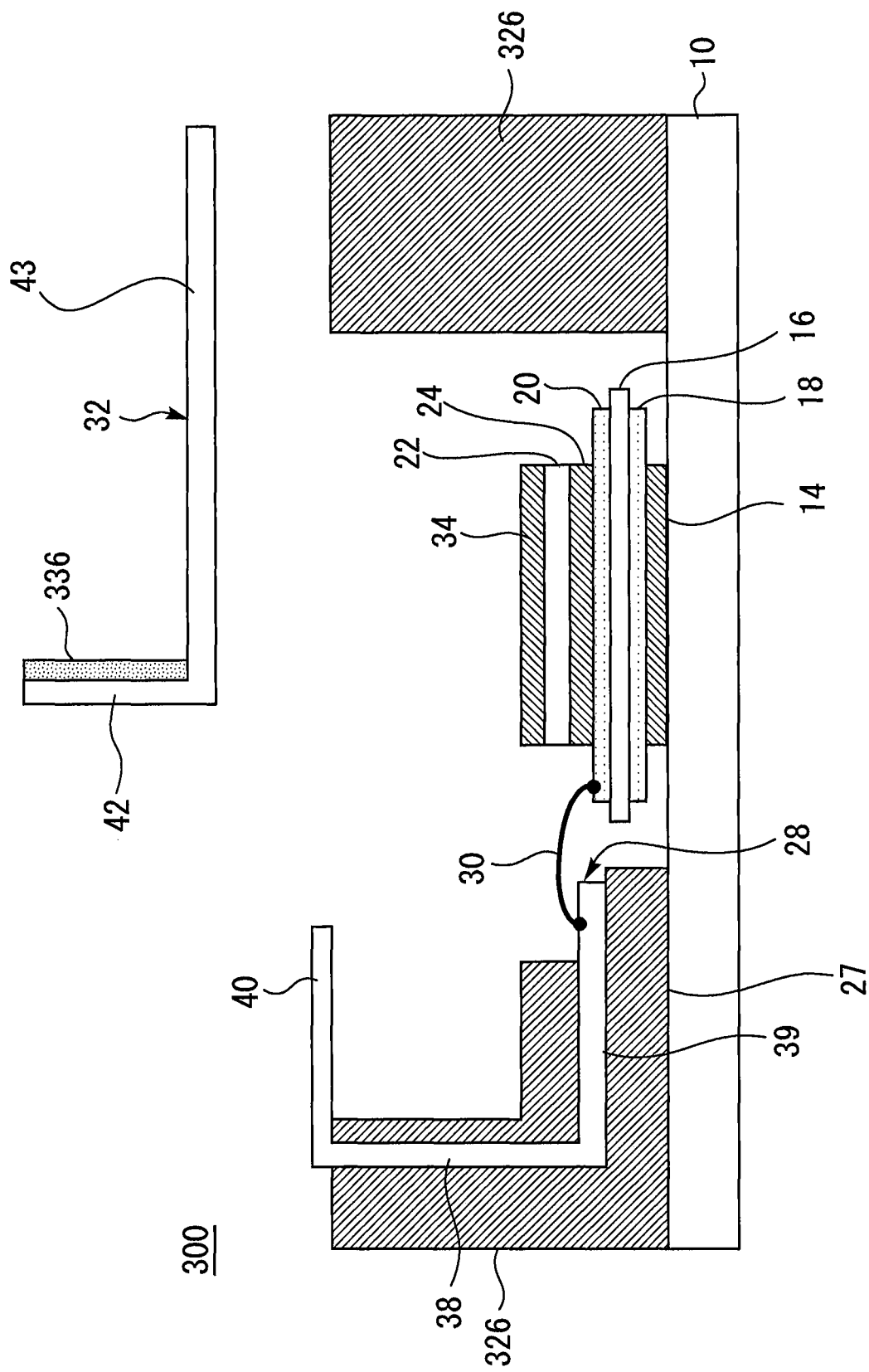
FIG. 4 is a sectional view illustrating a semiconductor device according to a second embodiment.

FIG. 4 is a sectional view illustrating a semiconductor device 300 according to a second embodiment. In the semiconductor device 300, the back surface electrode terminal 28 is integrated with a case 326. The front surface electrode terminal 32 is provided separately from the case 326 and the back surface electrode terminal 28. The front surface electrode terminal 32 is attached onto the case 326. Thus, the front surface electrode terminal 32 is provided above the back surface electrode terminal 28. FIG. 4 illustrates a state where the front surface electrode terminal 32 is detached from the case 326. In FIG. 4, the illustration of the seal material 44 and the lid 46 is omitted for ease of explanation.

A part of the vertical part 42 of the front surface electrode terminal 32 is covered with a resin part 336. The front surface electrode terminal 32 and the resin part 336 are integrated. The resin part 336 is fitted into the case 326 by a screw, press-fitting, or the like. As a result, the front surface electrode terminal 32 is attached onto the case 326. In other words, the resin part 336 and the front surface electrode terminal 32 are outserted into the case 326.

Next, a method of manufacturing the semiconductor device 300 according to this embodiment will be described. FIG. 5 is a flowchart illustrating the method of manufacturing the semiconductor device 300 according to the second embodiment. First, the case 326 and the back surface electrode terminal 28 are integrally formed. In this embodiment, the case 326 and the back surface electrode terminal 28 are formed by insert molding. In insert molding, resin is injected into a mold in a state where the back surface electrode terminal 28 is inserted into the mold. After that, the resin is hardened to thereby integrally form the case 326 with the back surface electrode terminal 28.

Similarly, the resin part 336 and the front surface electrode terminal 32 are integrally formed. The method for forming the case 326 and the back surface electrode terminal 28 is not limited to insert molding. Any method may be employed as long as the case 326 and the back surface electrode terminal 28 can be integrally formed. The method of forming the resin part 336 and the front surface electrode terminal 32 is not limited to insert molding. Any method may be employed as long as the resin part 336 and the front surface electrode terminal 32 are integrally formed.

Next, like in the first embodiment, the semiconductor chips 22 are mounted on the substrate 16. Next, like in the first embodiment, the substrate 16 is mounted on the base plate 10. Next, the case 326 is mounted on the base plate 10. In this case, the back surface electrode terminal 28 and the case 26 are integrated. Accordingly, the case 26 and the back surface electrode terminal 28 are provided on the semiconductor device 100 in this step.

Next, the step of wire bonding is carried out to connect the back surface electrode terminal 28 and the metallic pattern 20 with the wire 30. Next, the front surface electrode terminal 32 is outserted into the case 326. At this time, the resin part 336 is fitted into the case 326 in the manufacturing process. Thus, the front surface electrode terminal 32 is attached to the case 326. As this modified example, the front surface electrode terminal 32 may be directly attached to the case 326. When the front surface electrode terminal 32 is attached onto the case 326, the front surface electrode terminal 32 is provided above the back surface electrode terminal 28.

Next, the front surface electrode terminal 32 and the top surface of the semiconductor chip 22 are directly joined together with the solder 34. Next, like in the first embodiment, the step of sealing is carried out. After that, the lid 46 is attached to the case 326. Thus, the manufacturing process of the semiconductor device 300 according to this embodiment is terminated.

In this embodiment, the front surface electrode terminal 32 is provided separately from the case 326. Accordingly, after the step of wire bonding, the front surface electrode terminal 32 can be attached onto the case 326 in the manufacturing process. This facilitates the step of wire bonding as compared with the first embodiment.

FIG. 6 is a flowchart illustrating a method of manufacturing the semiconductor device 300 according to a modified example of the second embodiment. In the second embodiment, the step of sealing is carried out after the front surface electrode terminal 32 and the semiconductor chip 22 are joined together. The step of sealing is not limited to this step. Any step of sealing may be carried out as long as the step of sealing is carried out after the step of wire bonding. For example, as illustrated in FIG. 6, the front surface electrode terminal 32 may be provided above the back surface electrode terminal 28 after the step of sealing.

In the method of manufacturing the semiconductor device 300 according to the modified example, the step of sealing is carried out after the step of wire bonding. In the step of sealing, the seal material 44 is formed up to a height where the top surface of the semiconductor chip 22 is exposed. After the step of sealing, the front surface electrode terminal 32 is outserted into the case 326. After that, the front surface electrode terminal 32 and the semiconductor chip 22 are joined together.

In the modified example, the step of sealing is carried out in a state where the front surface electrode terminal 32 is not mounted. Accordingly, in a space formed below the front surface electrode terminal 32, it is easy for the seal material 44 to flow into the case 326. In other words, the seal material 44 can be filled in the case 326 while a gap formed between the seal material 44 and components is suppressed. This leads to an improvement in the reliability of the semiconductor device 300. Further, after the front surface electrode terminal 32 and the semiconductor chips 22 are joined together in this modified example, the seal material 44 may be further filled in the case 326.

Third Embodiment

FIG. 7 is a sectional view illustrating a semiconductor device 400 according to a third embodiment. The semiconductor device 400 does not include the base plate 10 and the solder 14. A substrate 416 according to this embodiment has a structure that also serves as a base plate. The back surface of the substrate 416 is provided with a metallic pattern 418. The top surface of the substrate 416 is provided with a metallic pattern 420. The substrate 416 and the metallic patterns 418 and 420 constitute an insulating substrate.

A case 426 surrounds the substrate 416 with no gap formed therebetween. The case 426 is provided in contact with a side surface of the substrate 416 and the metallic pattern 418. Thus, a package can be formed of the case 426 and the substrate 416, without providing the base plate 10. Accordingly, the structure of the semiconductor device 400 can be simplified, and the semiconductor device 400 can be further downsized.

Note that the technical features described in the above embodiments may be combined as appropriate.

In the semiconductor device according to the present invention, the front surface electrode terminal is directly joined to the top surface of the semiconductor chip. Accordingly, as compared with the connection using a wire, the resistance to a thermal cycle stress on a junction between the front surface electrode terminal and the semiconductor chip can be increased. Further, the back surface electrode terminal whose temperature is generally lower than the temperature of the front surface electrode terminal is connected with a wire, thereby downsizing the semiconductor device as compared with the case where the back surface electrode terminal is directly joined to the semiconductor chip. Consequently, an increase in life and downsizing of the semiconductor device can be achieved.

In the method of manufacturing the semiconductor device according to the present invention, the front surface electrode terminal is directly joined to the top surface of the semiconductor chip. Accordingly, as compared with the connection using a wire, the resistance to a thermal cycle stress on a junction between the front surface electrode terminal and the semiconductor chip can be increased. Further, the back surface electrode terminal whose temperature is generally lower than the temperature of the front surface electrode terminal is connected with a wire, thereby downsizing the semiconductor device as compared with the case where the back surface electrode terminal is directly joined to the semiconductor chip. Consequently, an increase in life and downsizing of the semiconductor device can be achieved.

Obviously many modifications and variations of the present invention are possible in the light of the above teachings. It is therefore to be understood that within the scope of the appended claims the invention may be practiced otherwise than as specifically described.

The invention claimed is:

1. A method of manufacturing a semiconductor device, comprising:
   a step of mounting a semiconductor chip on a metallic pattern using solder, the metallic pattern being provided on a top surface of a substrate;
   a step of providing a case surrounding the substrate, and a back surface electrode terminal in flat plate form, the back surface electrode terminal being buried in the case;
   a step of wire bonding connecting the back surface electrode terminal and the metallic pattern with a wire;
   a step of providing, above the back surface electrode terminal, a front surface electrode terminal in flat plate form, the front surface electrode terminal extending immediately above the semiconductor chip in parallel to the back surface electrode terminal, and directly joining the front surface electrode terminal to a top surface of the semiconductor chip; and
   a step of sealing an inside of the case with a seal material after the step of wire bonding.

2. The method of manufacturing a semiconductor device according to claim 1,
   wherein the case and the back surface electrode terminal are integrally formed, and
   the front surface electrode terminal is attached onto the case so that the front surface electrode terminal is provided above the back surface electrode terminal.

3. The method of manufacturing a semiconductor device according to claim 1, wherein after the step of sealing, the front surface electrode terminal is provided above the back surface electrode terminal.

* * * * *